United States Patent [19]

Bassous et al.

[11] 4,173,818

[45] Nov. 13, 1979

[54] METHOD FOR FABRICATING TRANSISTOR STRUCTURES HAVING VERY SHORT EFFECTIVE CHANNELS

[75] Inventors: Ernest Bassous, Riverdale; Tak H. Ning, Yorktown Heights; Carlton M. Osburn, Croton-on-Hudson, all of N.Y.

[73] Assignee: International Business Machines Corporation, Armonk, N.Y.

[21] Appl. No.: 910,254

[22] Filed: May 30, 1978

[51] Int. Cl.$^2$ .................................................. B01J 17/00
[52] U.S. Cl. ........................................ 29/571; 29/578
[58] Field of Search .................................. 29/571, 578

[56] References Cited

U.S. PATENT DOCUMENTS

| 3,996,657 | 12/1976 | Simko | 29/571 |
| 4,033,026 | 7/1977 | Pashley | 29/571 |

*Primary Examiner*—W. C. Tupman
*Attorney, Agent, or Firm*—John J. Goodwin

[57] ABSTRACT

A method, including a sequence of process steps, for fabricating insulated gate field effect transistors having very short effective channel lengths. In a first version of the method, the source and drain regions of the device are opened in one process step and self-alignment of the source and the drain to the gate is achieved in one masking step. The drain region is then masked and the source side of the channel is implanted to adjust the threshold voltage of the high threshold voltage channel region. In a second version of the method, the source region is opened and self-aligned with the gate prior to the opening of drain region. Implantation to adjust the threshold voltage of the high threshold voltage channel region takes place before the drain region is opened, and then the drain region is opened and self-aligned with the gate in a further masking step. In either version, the threshold voltage is adjustable and the channel length is controlled to be a small value.

10 Claims, 13 Drawing Figures

METHOD FOR FABRICATING TRANSISTOR STRUCTURES HAVING VERY SHORT EFFECTIVE CHANNELS

DESCRIPTION

1. Technical Field

The present invention relates to a process for the fabrication of Insulated Gate Field Effect Transistors (IGFET's) having very short effective channel lengths and more particularly to a process for fabricating IGFETs with short effective channel lengths wherein the high voltage threshold and the low voltage threshold regions of the channel, as well as their lengths, can be independently varied by chemical etching and ion implantation.

2. Background Art

It is well known in the art that the frequency response or speed of an IGFET (commonly referred to as an MOS transistor) is determined primarily by the channel length and parasitic capacitance, the frequency response or speed improving as the channel length and parasitic capacitance are reduced in value. The reduction in the channel length decreases the transit time for carriers travelling between source and drain, while reduction of the capacitance will decrease the charging time. The problem encountered in the prior art has been that short channel lengths were normally coupled with large parasitic capacitances because the separation between source and drain determines the amount of lateral diffusion under the gate for a given channel length, and the lateral diffused region, which is also highly doped, represents a large capacitance between gate and source or gate and drain. While these parasitic capacitances can be minimized by several techniques such as ion implantation and polysilicon gate processes, these techniques are limited in terms of the smallest channel length that can be achieved and in the control of the threshold voltage. Furthermore, MOS transistors that are conventionally processed with short channel length exhibit breakdown at low voltages.

The prior art has overcome this problem in part by means of a double/diffused MOS transistor, also known as D/MOS which is described in an article entitled "Double-Diffused MOS transistor Achieves Microwave Gain," Electronics, Feb. 15, 1971, by T. Cange, J. Koisic, H. J. Sigg and G. B. Dendelin. The D/Mos process involves a double diffusion at the source region and single diffusion at the drain region within a substantially intrinsic or very lightly doped substrate. The details of the fabrication of the D/Mos transistor in accordance with the above noted publication are to first grow an oxide on a substrate of starting material which can be n-, p-, or $\pi$ substrate type. The oxide is then opened in the source region and a first P-type diffusion is carried out herein. The drain region is now opened and n+ material is diffused into both the source and the drain regions in an oxidizing atmosphere as in conventional MOS fabrication. The diffusion through the original source region opening forms the required source diffusion. This provides a narrow p-type channel adjacent to the source with an extended drift region in the substrate material to the drain, thereby providing a 1-micron or less channel length. The processing is completed utilizing standard MOS technology procedures.

It is apparent that the above described D/MOS transistor, while overcoming many of the limitations on channel length of the prior art, can only be produced as a discrete transistor element. Fabrication thereof in an integrated circuit would require additional isolation steps to isolate the drain regions from other components in the circuit. In U.S. Pat. No. 3,996,655 issued Dec. 14, 1976 to James A. Cunningham et al on an application filed Aug. 25, 1975 entitled, PROCESSES OF FORMING INSULATED GATE FIELD EFFECT TRANSISTORS WITH CHANNEL LENGTHS OF ONE MICRON IN INTEGRATED CIRCUITS WITH COMPONENT ISOLATED AND PRODUCT, and assigned to Texas Instrument Corporation, there is provided a method of fabricating MOS transistors in integrated circuits wherein isolation is provided utilizing no more steps than is provided in the aforesaid D/MOS system for providing discrete micron channel transistors. Briefly, this is accomplished by providing the substrate of $\pi$, p- or n- material and forming an oxide on the surface thereof. The oxide is then opened at the drain regions to provide a p-type diffusion. The region where the source will be formed is then opened up in addition to the regions over the p-type drains and an n+ type diffusion is then provided with proper diffusion scheduling to provide three n+ type regions, two of the regions formed within the p-type regions previously diffused. The result is a driver coupled to a load, the driver-load combination being isolated from other components in the substrate by the large p-type region surrounding both of the drain regions.

The two prior art references described above employ what is known in the art as "double diffusion." Other examples of double diffusion techniques for fabricating transistors with short channel lengths are as follows.

U.S. Pat. No. 3,685,140 issued Aug. 22, 1972 to William E. Engler on an application filed Oct. 3, 1969 entitled SHORT CHANNEL FIELD-EFFECT TRANSISTORS and assigned to the General Electric Company describes an improved field-effect transistor having an exceedingly short channel length wherein a single edge defines the boundaries of both the source and drain regions. In one embodiment a gate electrode is formed over a thin oxide layer deposited on a semiconductor wafer of a first-conductivity type. An opposite-conductivity type impurity is diffused into the wafer adjacent the gate electrode. A first-conductivity-type impurity is diffused within the opposite-conductivity-type region forming a field-effect transistor having one edge of the gate electrode defining the boundary between the source and channel and the drain and channel regions. In another embodiment an edge of an insulating layer defines the boundaries of the source and drain regions.

In U.S. Pat. No. 4,038,107 issued July 26, 1977 to George Marr et al on an application filed Dec. 3, 1975 entitled, METHOD FOR MAKING TRANSISTOR STRUCTURES and assigned to the Burroughs Corporation, an extremely short channel FET is made by making a first ion implant through a polysilicon mask aperture, converting the surface of the polysilicon into $SiO_2$ constrict the aperture size and then making a second ion implant of the opposite type impurity through the constricted aperture. The $SiO_2$ growth effectively moves the edge of the mask by a small controlled distance. This permits a small controlled spacing between the two ion implants which is used for defining an extremely short FET channel. Alternatively a bipolar transistor with a narrow base zone can be made by analogous processing.

In U.S. Pat. No. 4,001,048 issued Jan. 4, 1977 to Gerald S. Meiling et al on an application filed May 23, 1975 entitled, METHOD OF MAKING METAL OXIDE SEMICONDUCTOR STRUCTURES USING ION IMPLANTATION, and assigned to Signetics Corporation a MOS structure is shown which includes a semiconductor body of one conductivity type. A layer of semiconductor material of opposite conductivity type is carried by the semiconductor body and has a planar surface. A mask is formed on the surface and has a predetermined pattern. A first diffusion region of said one conductivity type is formed in the body and is defined by a first PN junction extending to the surface below said mask and to said semiconductor body. A second diffused region of opposite conductivity type is formed within said first diffused region and has substitutional ions therein and being defined by a second PN junction extending to the surface. The first and second PN junctions define a channel of precise length underlying the mask. A layer of insulating material overlies the surface. Contact metallization is provided on the layer of insulating material and extends through said layer of insulating material.

The present invention relates to a method for fabricating IGFETs having very short effective channels, but the method does not use double diffusion techniques. In the conventional D/MOS double diffusion process, examples of which are described above, the channel is made up of two regions: a high-threshold (high-$V_T$) and a low-threshold (low-$V_T$) region. The device characteristics are determined mostly by the high-$V_T$ region and the length of the high $V_T$ region (L high) is kept very short.

The method of the present invention is distinct from the prior art because although the devices produced by the present invention are similar to D/MOS devices in that the channel is also made up of a high-$V_T$ region and a low-$V_T$ region and L high is very small, in the present invention, the threshold voltages of both the high-$V_T$ and the low-$V_T$ regions of the channel, as well as their lengths, can be independently varied by ion implantation and by chemical etching.

DISCLOSURE OF INVENTION

Figure 1A:
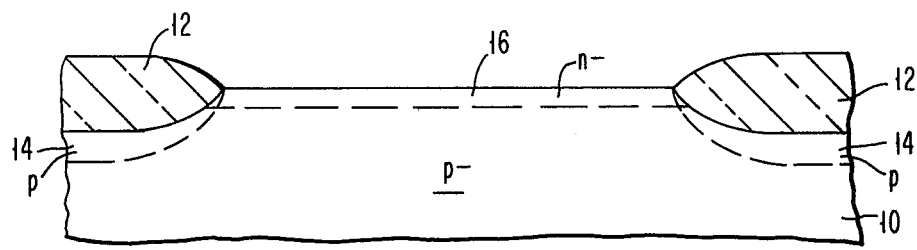
FIGS. 1A through 1F are cross-sectional views illustrating the steps of one embodiment of a method for fabricating an IGFET wherein self-alignment of both the source and the drain to the gate is performed in one masking step.

Insulated gate field-effect transistors (IGFETs), in general, include a pair of opposite-conductivity-type regions adjacent a major surface of a first-conductivity-type semiconductor material wherein the discrete regions, known as source and drain, are separated by a small-dimension channel region over which an overlapping gate electrode is positioned. Conduction between the two regions occurs through the surface-adjacent portions of the channel region between the two regions. This surface channel is formed and modulated by a potential applied to the gate electrode. The length (longitudinal dimension of the separation) of the channel between the two regions defines an exceedingly important parameter in the operation of a field-effect transistor. For a given channel width, the transconductance is inversely proportional to the length of the channel. Therefore a device having a given transconductance can be made physically smaller if the length of the channel can be reduced. This would not only decrease the gate capacity directly, but also reduce lead capacity between associated devices in an integrated circuit. Additionally, smaller devices could be more compactly arranged which would in general lead to improved yields. Further, since the ultimate frequency of operation of the field-effect transistor is limited by the channel transit time which is proportional to the channel length, by reducing the length of the channel, the ultimate frequency of operation could be increased.

The processing steps for two related versions of the method for fabricating an IGFET which exhibits the D/MOS characteristics of a high-$V_T$ region and a low-$V_T$ region channel and wherein the threshold voltages and lengths of the high-$V_T$ and low-$V_T$ regions can be independently varied, and where the source and drain are self-aligned to the gate are set forth as follows:

In the first version of the present method, where both sides of the channel region are opened prior to implantation, a substrate of suitable semiconductor material such as p-type silicon is first prepared so that ion implanted field oxide regions can be formed.

The initial preparation steps are well known in the art and are not shown in the drawings. The semiconductor substrate is provided and a first layer of insulating material such as silicon dioxide ($SiO_2$) is formed on the upper surface of the substrate by conventional thermal oxidation techniques to form a layer of $SiO_2$ in the range of 50 to 500 Angstroms thick. Thereafter, a layer of silicon nitride ($Si_3N_4$) is disposed on the silicon dioxide by conventional techniques such as chemical vapor deposition to provide a layer of $Si_3N_4$ in the range of 200 to 2,000 Angstroms thick. Then another layer of $SiO_2$ is disposed on the $Si_3N_4$ layer by conventional techniques such as chemical vapor deposition to form a third layer in the range of 200 to 2,000 Angstroms thick.

After the three layers are formed on the substrate a first mask is utilized in connection with conventional photolithographic and etching techniques to strip away all of the aforesaid three layers except for a rectangular portion which overlies what will be the channel region of the resultant device.

Next the field region is ion implanted using boron for the field doping and thermal oxide is grown in the silicon substrate (i.e. the semi-ROX technique) to form recessed oxide in the range of 3,000 to 10,000 Angstroms thick. The three layers of $SiO_2$, $Si_3N_4$ and $SiO_2$ over the channel region are stripped away and the channel region is ion implanted using phosphorus or arsenic for depletion mode threshold adjustment. The resultant structure is shown in FIG. 1A including substrate 10, the recessed oxide 12, the field oxide implantation 14 which diffused out during growth of the recessed oxide 12, and the $n^-$ implanted channel region 16.

Figure 1B:
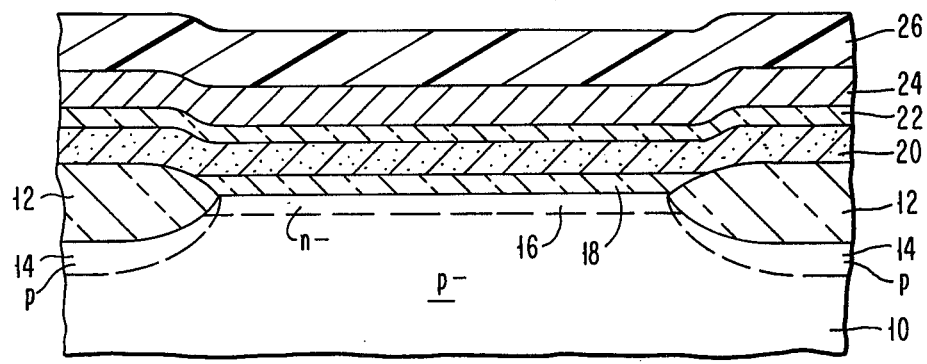

In the next step, as shown in FIG. 1B, the gate oxide 18 ($SiO_2$) is thermally grown to a thickness in the range 100–2,000 Angstroms. Then a layer 20 of polysilicon is formed by chemical vapor deposition to form a polysilicon gate having a thickness in the range 2,000–7,000 Angstroms. The polysilicon gate layer 20 is then doped to $n+$ and a layer 22 of $SiO_2$ is formed either thermally or by chemical vapor deposition to a thickness in the range 500–2,000 Angstroms. Alternatively, the polysilicon layer can be doped in situ during deposition. Next, a layer 24 of tungsten is disposed on layer 22 which will be used for implantation masking. A layer of photoresist 26 therefore, is applied over the tungsten layer 24.

At this point, after the formation of the structure of FIG. 1B, the method may proceed in either of two versions. In the first version, where both sides of the channel are opened prior to source and drain implantation, the source and drain spacing is defined by masking. More particularly, a mask is placed over the photoresist layer 26, the photoresist is exposed, developed, and chemically etched, the tungsten exposed by the removed resist is chemically etched, the SiO2 and then the exposed polysilicon are removed by directional etching techniques such as reactive ion etching to form the structure illustrated in FIG. 1C wherein the source and drain regions are opened and the polysilicon gate 20 is defined. The source and drain regions are formed by ion implantation using phosphorus or arsenic as dopants. The recessed oxide 12 and the photoresist 26 serve as masks for the implantation, therefore the source and drain regions 28 and 30 are self-aligned to the polysilicon gate 20.

Figure 1C:
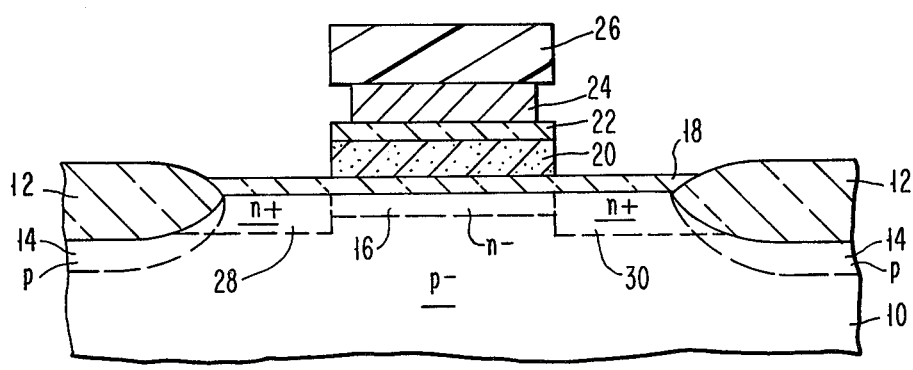
Figure 1D:
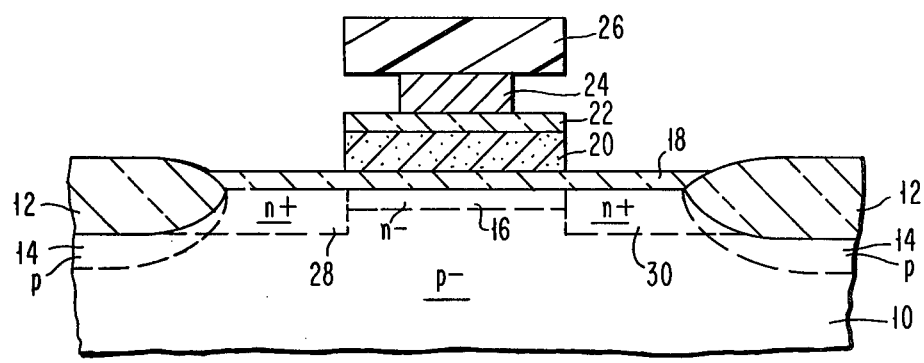
Figure 1E:
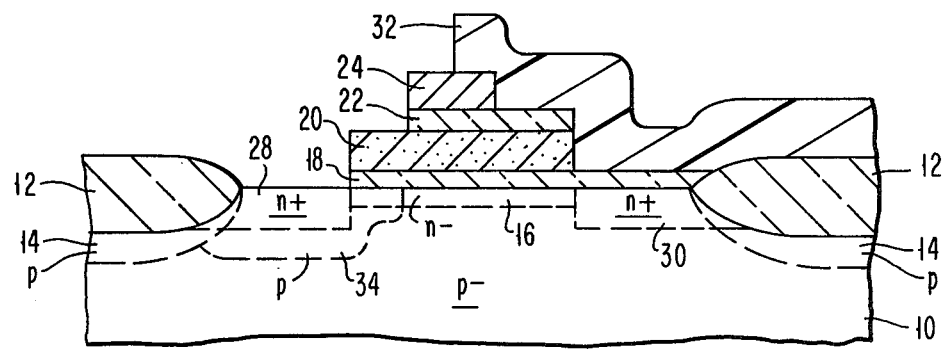

Next, without removing the photoresist 26, a wet chemical etch is employed to laterally undercut the tungsten 24 as illustrated in FIG. 1D to provide space for later ion implantation of the source side for threshold adjustment. Referring to FIG. 1E, a new layer 32 of photoresist is applied over the structure and is then masked, exposed, developed and etched away over the source side of the structure as shown. This opens the source side of the structure for ion implantation (i.e. boron). An ion implantation step is performed using the tungsten layer 22 and photoresist layer 32 as a mask. It is seen in FIG. 1E that the boron goes deep into the source region 28 but shallow into the channel region under the polysilicon layer 18 because the polysilicon layer acts as a mask for the channel region. Thus implanted boron region 34 is controlled as desired to adjust the threshold $V_T$ so as to provide a high-$V_T$ and low $V_T$ region D/MOS-like structure. That is, there are two threshold regions in the channel, the implanted region 34 under SiO2 layer 18 and the non-implanted region 16 under SiO2 layer 18.

Figure 1F:
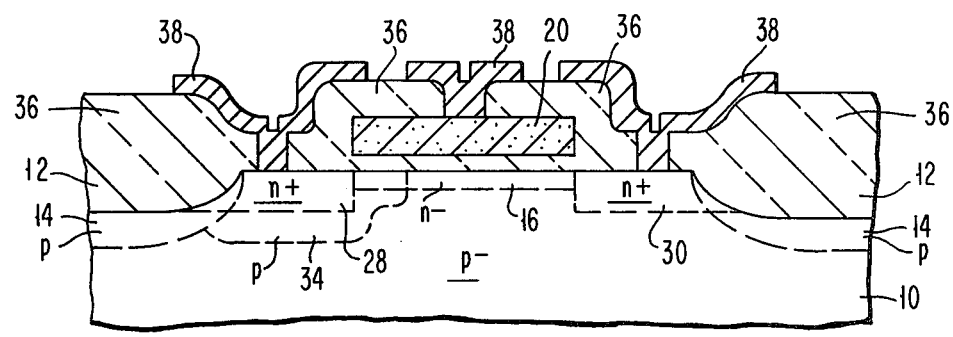
Figure 2A:
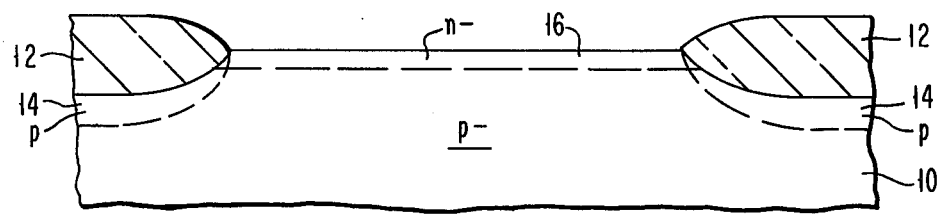
FIGS. 2A through 2G are cross-sectional views illustrating the steps of another embodiment of a method for fabricating an IGFET wherein separate masking steps are used to self-align the source and the drain to the gate.

Finally, the photoresist layer 32 is removed, the tungsten 24 is removed, silicon dioxide is regrown to form a layer 36 of SiO2 as shown in FIG. 1F. Layer 36 may be started by thermal oxidation and then completed by chemical vapor deposition to speed up the process. Contact holes in silicon dioxide layer 36 are opened in the source, drain and gate regions as shown in FIG. 1F by typical photolithographic masking and etching, and then the resulting structure is metallized with aluminum or with (Pd2Si+Al) and the metal 38 is delineated by conventional techniques. The other version or embodiment of the method to be described below may be used if, for some reason the photoresist layer 32 of FIG. 1E does not provide adequate masking or stopping power for the boron implantation 34 used for the threshold adjustment. In such instance, an alternative process may be used wherein only one side (the source side) of the structure is opened. The first steps of the alternative version of the method are the same as previously described. Thus, FIGS. 2A and 2B of the alternative version are identical to FIGS. 1A and 1B.

Figure 2B:
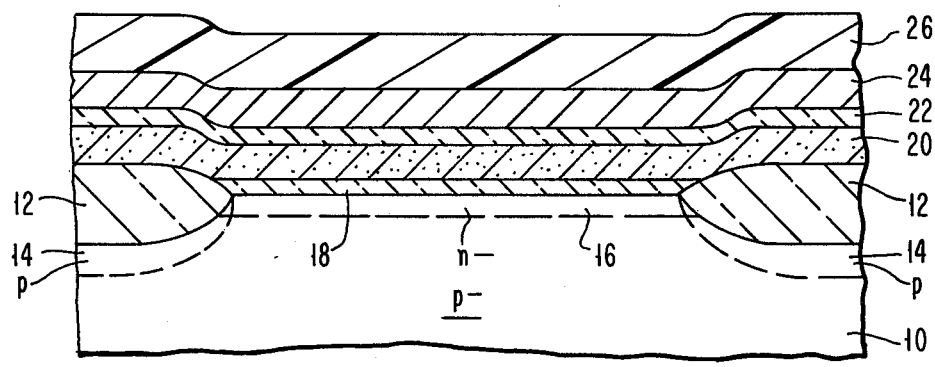
Figure 2C:
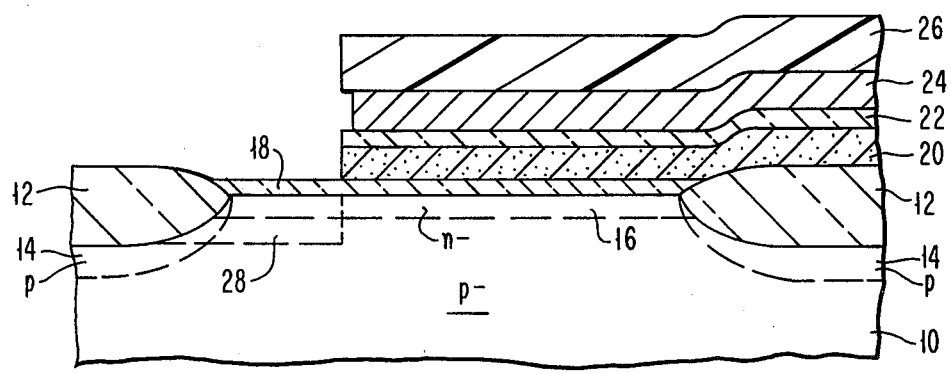

After performing the steps which resulted in the structure of FIG. 2B, photoresist layer 26 is masked, exposed, developed and etched, the exposed tungsten layer 24 is chemically etched and the exposed portions of the SiO2 layer 22 and the polysilicon layer 20 are removed by reactive etching to form the structure illustrated in FIG. 2C wherein only the source region is opened. The basic difference between the fabrication of the structures of FIGS. 1C and 2C is the configuration of the mask employed. The source junction 28 is then formed by ion implantation and is self-aligned to the polysilicon gate material 20 as a result of the masking effect of the recessed oxide 12 on one side and the polysilicon layer 20, SiO2 layer 22, tungsten layer 24 and resist layer 26 on the other side. Alternatively, the source junction 28 may be implanted at a later step at the same time that the drain junction is implanted.

Figure 2D:
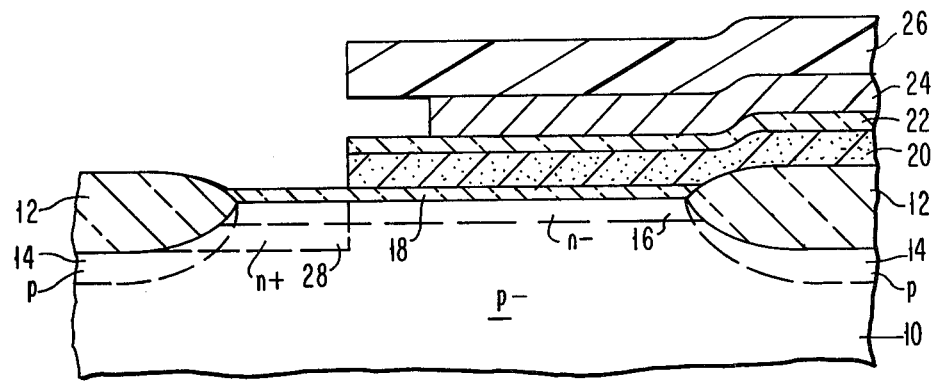
Figure 2E:
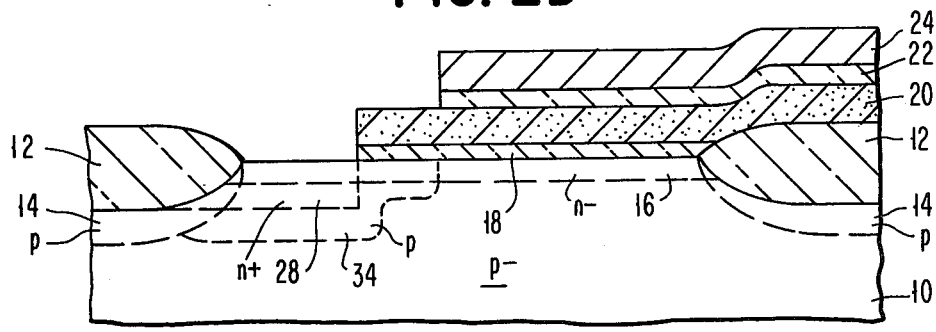

The source side of the tungsten 24 is undercut by lateral wet chemical etching in a manner the same as described relative to FIG. 1D to produce the structure shown in FIG. 2D. The resist layer 26 is then removed and the exposed portions of the SiO2 layers 18 and 22 are etched away to provide the structure illustrated in FIG. 2E. The ion implantation of boron or other suitable dopant is then performed. The SiO2 layer 22 and the tungsten layer 24 prevent any implantation into the drain side of the structure. The portion of polysilicon layer 20 over the left channel region causes a reduced implantation into the left channel region relative to the implantation into the open source region 28. This implantation 34 shown in FIG. 2E provides the threshold adjustment which causes the structure to be D/MOS-like in performance.

Figure 2F:
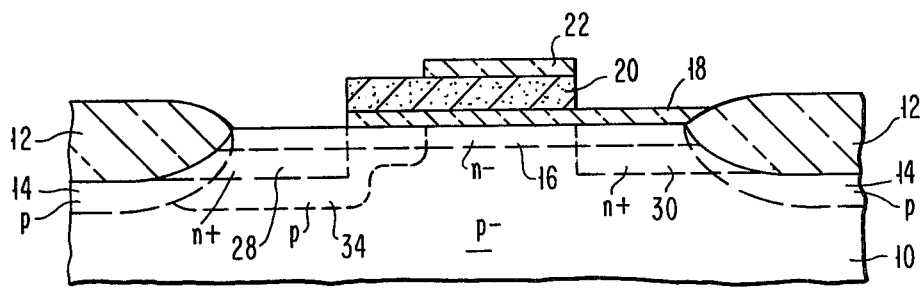
Figure 2G:
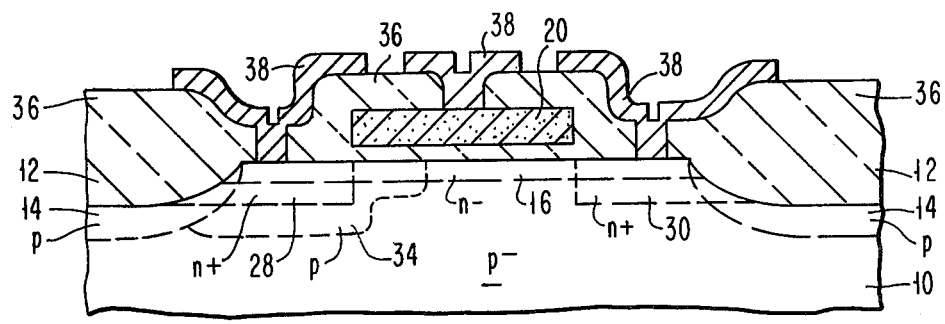

In the next step the tungsten 24 is removed and a layer of photoresist is formed over the structure. Using conventional lithographic techniques the gate on the drain side is defined and the drain region is opened. Then the photoresist is removed and another ion implantation is performed to form the drain 30 as shown in FIG. 2F. It should be noted that the implantation step also further implants the source region 28. Therefore, if desired, the previous step of implanting the source region 28 shown in FIG. 2C may be eliminated and the source region 28 may be formed at the same time as the drain region 30 in the step indicated at FIG. 2F.

Finally, as in step 1F, an SiO2 layer 36 is formed partially by thermal oxidation and partially by chemical vapor deposition techniques. Contact holes are then opened into the source, gate and drain and metal 38 is deposited and delineated.

In the present method, including the two versions described, the length of the high-$V_T$ portion of the channel is defined by the tungsten etching step. Tungsten is specified because of its well known etching characteristics, however other metals such as gold, molybdenum, chromium, titanium/chromium etc. can also be employed.

Instead of photoresist, sputtered SiO2 can be used as an etch mask for the metal layer.

In the first version of the method illustrated in FIGS. 1A–1F self-alignment of the source and the drain to the gate takes place in one masking step and therefore the lengths of the high-$V_T$ regions can be well controlled. In the second version of the method illustrated in FIGS. 2A–2G separate masking steps are used to self-align the source and the drain to the gate and therefore less control is obtained over the length of the low-$V_T$ region. However, variations in the length of the low-$V_T$ region have minimal effect on the device characteristics which are determined mainly by the high-$V_T$ portion of the channel.

INDUSTRIAL APPLICABILITY

The method of this invention is effective for fabricating transistors, particularly insulated gate field effect transistors (IGFET) having very short channel lengths for improved frequency response or speed. The method also results in an IGFET which has a channel made of two threshold regions and therefore exhibits the properties of a double/ diffused MOS transistor (D/MOS). However, unlike the D/MOS process, the present method permits the channel length and the thresholds to be independently varied.

No advanced lithographic tools or critical alignment steps are required in the method, and the method allows both enhancement-mode devices and depletion mode devices to be fabricated on the same chip. The heat cycles involved in the method are much less than those used in conventional D/MOS processes and therefore doping profiles in the channel and field regions can be better controlled.

While we have illustrated and described the preferred embodiments of my invention, it is to be understood that we do not limit myself to the precise constructions herein disclosed and the right is reserved to all changes and modifications coming within the scope of the invention as defined in the appended claims.

Having thus described our invention, what we claim as new, and desire to secure by Letters Patent is:

1. A method for fabricating a transistor structure having a short channel length including controlled high voltage threshold and low voltage threshold regions comprising the steps of:
   A. forming a first mask having first and second opposed edges over a first area of a body of semiconductor material of one conductivity type,
   B. ion implanting impurities into said semiconductor material at said edges of said first mask to form field regions,
   C. growing thermal oxide in said semiconductor material at said edges of said first mask to form field oxide regions,
   D. removing said first mask and ion implanting impurities of opposite conductivity type into said semiconductor material between said field oxide regions to form a channel region,
   E. forming a layer of gate oxide over said implanted channel region,
   F. forming and doping a layer of polysilicon over said layer of gate oxide to form doped polysilicon gate material of opposite conductivity type,
   G. forming a layer of insulating material over said layer of polysilicon gate material,
   H. forming a layer of metal over said layer of insulating material,
   I. forming a layer of photoresist material over said layer of metal,
   J. using a second mask for defining at least one of a source and drain region and at least one side of a polysilicon gate region, exposing and etching said photoresist, metal, insulating material and polysilicon material to open said at least one of said source and drain regions and to form at least one side of a polysilicon gate,
   K. ion implanting impurities through said at least one open source and drain regions to form at least one of said transistor source and drain in said body of semiconductor material, said at least one of said source and drain being aligned with said at least one side of said polysilicon gate,
   L. laterally etching away a predetermined amount of at least one side of said remaining metal layer over at least one side of said channel region,
   M. and, using said remaining metal layer as a third mask, ion implanting a controlled amount of impurities into one side of said channel region to adjust the threshold voltage of the high threshold voltage channel region for said transistor structure.

2. A method according to claim 1 wherein said second mask in step J defines both a source and a drain region and the sides of a central polysilicon gate region, said source region being defined between one of said field oxide regions and one side of said polysilicon gate region and said drain region being defined between the other one of said field oxide regions and said defined polysilicon gate region,
   wherein said exposing and etching process opens said source and drain regions and forms both sides of a polysilicon gate,
   wherein said ion implanting step K forms both said source and drain in said body of semiconductor material,
   and wherein during said etching step L a predetermined amount of both sides of said remaining metal layer is laterally etched.

3. A method according to claim 2 further including, between step L and step M, the step of disposing a layer of photoresist over the top of the drain side of said structure to form a mask for said ion implantation step M such that only the source side of said channel region is ion implanted, 4. A method according to claim 3 including the further steps after step M including:
   N. removing the photoresist layer applied in step M and the remaining metal layer,
   O. forming a final insulating layer over said structure,
   P. by conventional lithographic techniques, opening holes in said final insulating layer for source, drain and gate contacts,
   Q. and forming and delineating a metal layer over said structure by conventional metallization techniques.

5. A method according to claim 1 wherein said second mask in step J defines a source region and one side of a polysilicon gate region, said source region being defined between one of said field oxide regions and said one side of said defined polysilicon gate region,
   wherein said exposing and etching process opens said source region and forms one side of a polysilicon gate,
   wherein said ion implanting step K forms a source in said body of semiconductor material,
   and wherein during said etching step L, a predetermined amount of the source side of said remaining metal layer is laterally etched.

6. A method according to claim 5 further including, between step L and step M, the step of removing the remainder of the layer of photoresist formed in step I and removing the open portions of the layer of gate oxide formed in step E and the layer of insulating material formed in step G.

7. A method according to claim 6 including the further steps after step M including:
   N. removing the remaining metal layer,
   O. forming a final insulating layer over said structure, P. by conventional lithographic techniques, opening holes in said final insulating layer for source, drain and gate contacts, Q. and forming and delineating a metal layer over said structure by conventional metallization techniques.

8. A method according to claim 1 wherein said metal used in step H is tungsten said impurities implanted in steps K and M are boron ions.

9. A method according to claim 4 wherein said metal used in step Q is aluminum.

10. A method according to claim 7 wherein said ion implanting step K is boron ion implantation and said metal used in step Q is aluminum.

* * * * *